(12) United States Patent
Lee

(10) Patent No.: US 7,663,914 B2
(45) Date of Patent: Feb. 16, 2010

(54) METHOD OF PROGRAMMING A MULTI BIT FLASH MEMORY DEVICE TO AVOID PROGRAMMING ERRORS AND A DEVICE IMPLEMENTING THE SAME

(75) Inventor: Seung-Jae Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 215 days.

(21) Appl. No.: 12/005,362

(22) Filed: Dec. 27, 2007

(65) Prior Publication Data

US 2008/0158955 A1 Jul. 3, 2008

(30) Foreign Application Priority Data

Dec. 27, 2006 (KR) .................. 10-2006-0135292

(51) Int. Cl.
*G11C 16/04* (2006.01)
(52) U.S. Cl. .................. 365/185.03; 365/185.17; 365/185.18; 365/185.22; 365/185.24
(58) Field of Classification Search ............ 365/185.03, 365/185.17, 185.18, 185.22, 185.24
See application file for complete search history.

(56) References Cited

U.S. PATENT DOCUMENTS

| | | | |
|---|---|---|---|
| 5,570,315 A | 10/1996 | Tanaka et al. | |
| 5,923,587 A | 7/1999 | Choi | |
| 5,986,929 A | 11/1999 | Sugiura et al. | |
| 6,353,553 B1 | 3/2002 | Tamada et al. | |
| 6,400,601 B1 | 6/2002 | Sudo et al. | |
| 6,987,694 B2 | 1/2006 | Lee | |
| 7,035,144 B2 | 4/2006 | Kim et al. | |
| 7,082,056 B2 | 7/2006 | Chen et al. | |
| 7,102,927 B2 | 9/2006 | Jo | |
| 7,139,192 B1 * | 11/2006 | Wong .................. | 365/185.03 |
| 2006/0146433 A1 * | 7/2006 | Chan et al. ............ | 360/31 |
| 2006/0171210 A1 | 8/2006 | Nagashima et al. | |
| 2009/0141556 A1 * | 6/2009 | Baik .................. | 365/185.19 |

FOREIGN PATENT DOCUMENTS

| | | |
|---|---|---|
| JP | 07-161852 | 6/1995 |
| JP | 10-320987 | 12/1998 |
| JP | 2001-014873 A | 1/2001 |
| JP | 2001-210082 | 8/2001 |
| JP | 2005-032431 | 2/2005 |
| KR | 10-1997-0029851 A | 6/1997 |
| KR | 10-2004-0036015 A | 4/2004 |
| KR | 10-2006-0007629 | 1/2006 |
| KR | 10-2007-0031594 A | 3/2007 |

* cited by examiner

*Primary Examiner*—Connie C Yoha
(74) *Attorney, Agent, or Firm*—Lee & Morse, P.C.

(57) ABSTRACT

A method of programming a multi bit flash memory device may perform a $k^{th}$ preliminary verify read operation before performing a $k^{th}$ program operation according to a $k^{th}$ page of program data, where n and k integers, $n \geq 2$, and $1 \leq k \leq n$. That is, where a $(k-1)^{th}$ program operation produces one or more expanded threshold voltage distribution regions due to the presence of fast cells, the $k^{th}$ preliminary verify read operation may detect fast cells that have already reached their target threshold states without having had to undergo the $k^{th}$ program operation. The $k^{th}$ preliminary verify read operation also may set the detected fast cells to have program-inhibit status so as to reduce or prevent undesired further programming of the detected fast cells that would otherwise occur during the $k^{th}$ program operation.

20 Claims, 7 Drawing Sheets

METHOD OF PROGRAMMING A MULTI BIT FLASH MEMORY DEVICE TO AVOID PROGRAMMING ERRORS AND A DEVICE IMPLEMENTING THE SAME

BACKGROUND OF THE INVENTION

1. Field of the Invention

Embodiments disclosed herein relates to a semiconductor memory device. More particularly, embodiments relate to a programming method of a multi bit flash memory device.

2. Description of the Related Art

When 1-bit data is stored in one memory, e.g., a flash memory, each memory cell has a threshold voltage that falls within one of two threshold voltage distributions, which correspond to data 1 or data 0. On the other hand, when 2-bit data is stored in a flash memory, each memory cell can have a threshold voltage falling within one of four threshold voltage distributions. Additionally, when 3-bit data is stored in a flash memory, each memory cell can have a threshold voltage falling within one of eight threshold voltage distributions. Various technologies for storing 4-bit data into one memory cell of a flash memory are known.

A memory cell of a flash memory device includes a transistor. Typically, the memory cells of a flash memory device are programmed by injecting electrons into the floating gates of the transistors, respectively. Due to manufacturing tolerances, there is variation in the rates at which the floating gates accumulate charge. For a given desired threshold voltage to which a set of the memory cells is to be programmed, the variation in charge accumulation rates will result in a circumstance that the desired threshold voltage falls within a distribution of resultant actual threshold voltages representing a desired threshold voltage state. Some of the memory cells will accumulate charge in their floating gates at a significantly higher rate than those rates that fall within a normal distribution of charge accumulation rates. The memory cells having the abnormally high charge accumulation rates are referred to as fast cells.

For a given duration of a program operation, during which charge is injected into a floating gate of a memory cell's transistor, fast cells will achieve relatively higher threshold voltages than normal cells, i.e., will be programmed into relatively higher threshold voltage states. This may result in a problem that the fast cells may fall within voltage threshold states that are higher than intended, representing programming errors. Techniques to correct programming errors are known. Such fast cell errors are a significant portion of the error correction load.

SUMMARY OF THE INVENTION

Embodiments of the present invention provide a method of programming a multi bit flash memory device, and the multi bit flash memory device per se, that respectively substantially overcome one or more of the problems of the related art.

It is therefore a feature of an embodiment of the present invention to provide a multi bit flash memory device, and the multi bit flash memory device per se, that may perform a $k^{th}$ preliminary verify read operation before performing a $k^{th}$ program operation according to a $k^{th}$ page of program data, where n and k integers, $n \geq 2$, and $1 \leq k \leq n$. That is, where a $(k-1)^{th}$ program operation produces one or more expanded threshold voltage distribution regions due to the presence of fast cells, the $k^{th}$ preliminary verify read operation may detect fast cells that have already reached their target threshold states without having had to undergo the $k^{th}$ program operation. The $k^{th}$ preliminary verify read operation also may set the detected fast cells to have program-inhibit status so as to avoid, i.e., to reduce or prevent, undesired further programming of the detected fast cells that would otherwise occur during the $k^{th}$ program operation.

At least one of the above and other features and advantages of embodiments may be realized by providing a method of programming a multi bit flash memory device having n-bit memory cells, where n is an integer and $n \geq 2$, via n program operations performed according to n pages of program data, respectively. Such a method may include detecting, before a kth program operation, memory cells that already have reached target threshold voltage states, respectively, where k is an integer and $1 \leq k \leq n$, setting the detected memory cells to have a program-inhibit status, and performing the $k^{th}$ program operation to make non-program-inhibited memory cells achieve target threshold voltage states, respectively. For example, it may be that n=4 such that each of the memory cells of the multi bit flash memory device stores 4-bit data corresponding to sequentially provided first to fourth pages of program data. The setting mentioned a given detected memory cell to have program-inhibit status and the performing of the kth program operation, as respectively mentioned above, may determine a next more significant bit (NMSB) of the n-bit data to be stored in the given memory cell.

Such a method as mentioned above may further include selecting memory cells for the kth program operation according to a kth page of program data such that only non-program-inhibited memory cells are operated upon when performing the kth program. The detecting and the setting may precede the selecting. The performing of the kth program operation may include providing a program voltage to a word line of the selected memory cells, verifying whether non-program-inhibited ones amongst the selected memory cells are programmed with a target threshold voltage or not, and repeating the providing of the program voltage and the verifying until threshold voltages of the non-program-inhibited memory cells reach the target threshold voltage states, respectively. The selecting of memory cells may include selecting ones for which corresponding values in the kth page of program data are logic 0.

Such a method as mentioned above may further include providing a program voltage to word lines of the non-program-inhibited memory cells, and post-program verifying whether the non-program-inhibited memory cells have been programmed with target threshold voltages. The providing of the program voltage and the post-program verifying may be included in an iterative loop. The method may further include repeating the loop until threshold voltages of the non-program-inhibited memory cells achieve the target threshold voltage states, respectively. For a given threshold voltage state, the post-program verifying may include determining which of the non-program-inhibited memory cells have threshold voltages falling between a lower verify voltage and an upper verify voltage.

For such a method as mentioned, the detecting, before a kth program operation, of memory cells that already have reached target threshold voltage states, respectively, may include performing preliminary read verify operations for voltage threshold states that are intended to populate with memory cells as a result of the kth program operation. The preliminary verify read operations, for a given threshold voltage state, may include determining which memory cells have threshold voltages falling between a lower verify voltage and an upper verify voltage. The setting of the detected memory cells to have the program-inhibit status may maintain substantially the same threshold values for the detected memory cells before and after the kth program operation.

At least one of the above and other features and advantages of embodiments may be realized by providing a multi bit flash memory device. Such a device may include a cell array including a plurality of n-bit memory cells, where n is an integer and n≧2, a page buffer block connected to bit lines of the memory cells and adapted to perform read and program operations of the memory cells, a program controller adapted to perform at least the following, namely detecting, before performing a $k^{th}$ program operation according to a $k^{th}$ page of program data, memory cells that already have reached target threshold voltage states, respectively, where k is an integer and 1≦k≦n, and setting the detected memory cells to have a program-inhibit status, and a high voltage generator adapted to provide a voltage to word lines of non-program-inhibited memory cells for the $k^{th}$ program operation or a post-$k^{th}$-program verify operation.

At least one of the above and other features and advantages of embodiments may be realized by providing a memory system that includes a memory controller, and a flash memory device, such as mentioned above, operatively connected the memory controller.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
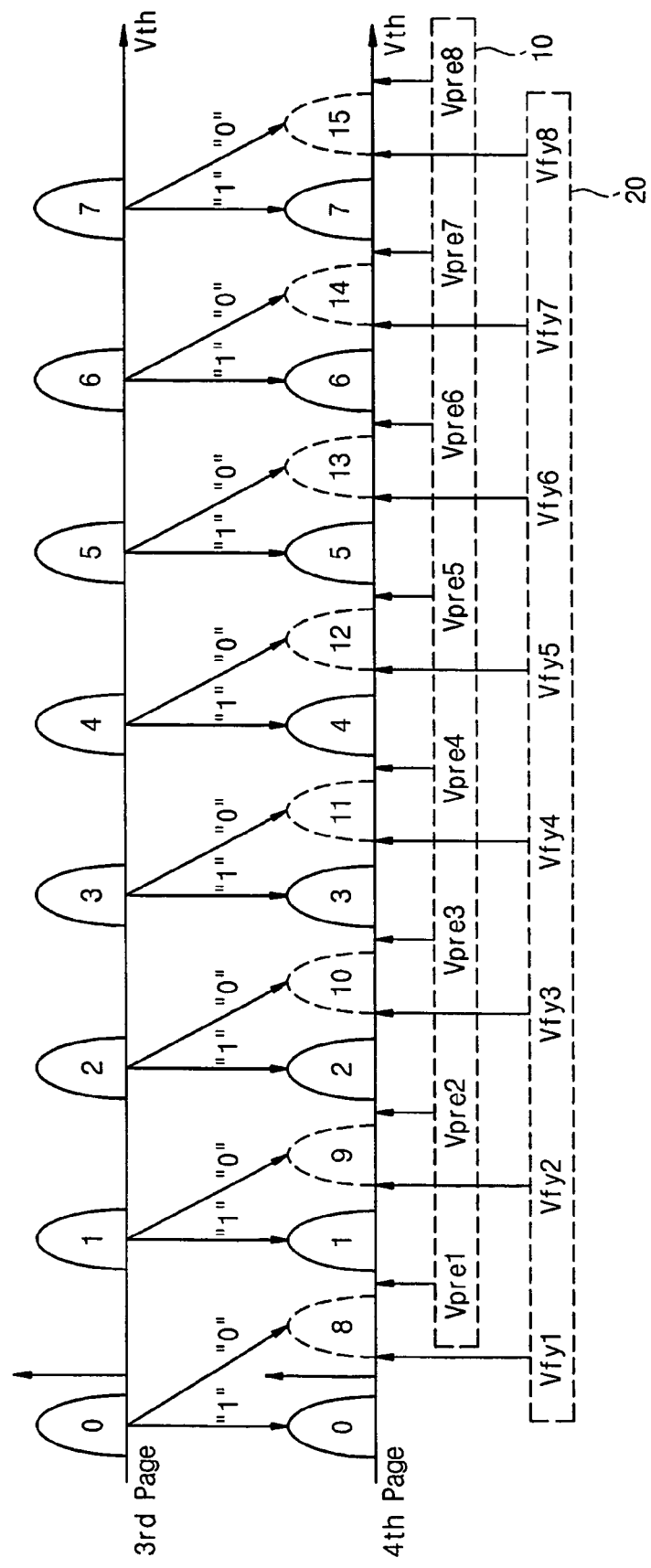
FIG. 1 illustrates a comparative example of a method of programming 4-bit memory cells of a flash memory device.

Korean Patent Application No. 10-2006-135292, filed on Dec. 27, 2006, in the Korean Intellectual Property Office, and entitled: "Programming Method of Multi Bit Flash Memory Device Capable of Blocking Program Error," is incorporated by reference herein in its entirety.

The present invention will now be described more fully hereinafter with reference to the accompanying drawings, in which exemplary embodiments of the invention are illustrated. In particular, a flash memory device is used as a context to illustrate exemplary embodiments of the present invention. The invention may, however, be embodied in different forms and should not be construed as limited to the exemplary embodiments set forth herein. For example, the present invention may be applied to memory devices other than flash memory devices and/or other non-memory devices. These embodiments are provided so that this disclosure will be thorough and complete, and will fully convey the scope of the invention to those skilled in the art.

In the figures, dimensions and/or proportions may be exaggerated for clarity of illustration. It will also be understood that when an element is referred to as being "connected to" another element, it may be directly connected or indirectly connected, i.e., intervening elements may also be present. Further, it will be understood that when an element is referred to as being "between" two elements, it may be the only element layer between the two elements, or one or more intervening elements may also be present. Like reference numerals refer to like elements throughout.

The comparative example of FIG. 1 assumes the context of programming a 4-bit memory cell of a flash memory device. Sixteen (16) threshold voltage states are needed for storing 4-bit data. To program 4-bit data into memory cells, a multi-page programming process is performed using four pages of program data that are sequentially input into the memory cells on a page by page basis. Each memory cell has a corresponding single bit value in each page of program data, with the four pages of program data cumulatively representing the 4-bit values to be stored in each memory cell.

More particularly, FIG. 1 assumes that a third page of data has been programmed and illustrates what happens as a fourth page of data is being programmed. Once the third page of program data has been programmed, each memory cell has a threshold voltage that falls within one of the threshold voltage states 0 to 7. The fourth page of program data is used to further program the threshold voltages of the memory cells according to corresponding single bit values in the fourth page of program data. Depending upon the bit value in the fourth page of program data for a given memory cell, a fourth program operation either leaves the given memory cell in one of the threshold voltage states 0 to 7, or further programs the given memory cell to be in a corresponding one of the threshold voltage states 8 to 15.

For example, assume that a given memory cell has a threshold voltage that falls within a threshold voltage state 0 after a third program operation according to the third page of program data. If the fourth page of program data has a bit value of logic 1 for the given memory cell, then the given memory cell will be set to have a program-inhibit status before the fourth program operation occurs. The threshold voltage of the given memory cell will not be changed by the fourth program operation in view of the given memory having been set to have program-inhibit status. In contrast, if the fourth page of program data has a bit value of logic 0 for the given memory cell, then it is intended that the fourth program operation will program the threshold voltage of the given memory cell so as to fall within the threshold voltage state 8.

More generally, when a bit value of the fourth page of program data is logic 0 for a given memory cell, it is intended that a threshold voltage of the given memory cell that falls within one of the threshold voltage states 0 to 7 before the fourth program operation will be changed to fall within a corresponding one of the threshold voltage states 8 to 15, respectively, as a result of the fourth program operation. Conversely, when a bit value of the fourth page of program data is logic 1 for a given memory cell, it is intended that a threshold voltage of the given memory cell that falls within one of the threshold voltage states 0 to 7 before the fourth program operation will be maintained, i.e., will remain unchanged, as a result of the fourth program operation.

After a given program operation, e.g., the fourth program operation, the memory cells programmed with the threshold voltage states 8 to 15 are program-verified. A program verify operation may be generally performed according to an arrangement order of the threshold voltage states 8 to 15. That is, after performing a verify read operation on a state 8, a verify read operation may be performed on a state 9. Next, verify read operations may be sequentially performed to detect whether the memory cells are programmed in states 10 to 15. As a result of having performed the verify read operation for each one of states 8 to 15, the memory cells that are determined to satisfy a condition of program-pass are set to have program-inhibit status, and the memory cells that are determined to satisfy a condition of program-fail are set to be reprogrammed (or, in other words, further programmed).

The verify read operation may include a read operation that is performed twice on each threshold voltage state. The verify read operation for determining whether the memory cell is programmed in a given state supplies a first verify voltage Vpre1 to Vpre8 to the word line of the memory cells first to select memory cells corresponding to states 0 and 8, respectively. When a second verify voltage Vfy1 to Vfy8 is supplied to the word line of the selected memory cells, the memory cells programmed with a threshold voltage greater than the second verify voltage Vfy1 to Vfy8, respectively, are set to have program-inhibit status. Through these operations, the memory cells having a threshold voltage between the first verify voltage Vpre1 to Vpre8 and the second verify voltage Vfy2 to Vfy8, respectively, are determined as program-pass and then are set to have program-inhibit status. However, the memory cells not having a threshold voltage between the first verify voltage Vpre1 to Vpre8 and the second verify voltage Vfy2 to Vfy8, respectively, are set to be reprogrammed.

Once the verify read operation for a first state, e.g., state 8 using verify voltages Vpre1 and Vfy1, is finished, then a verify read operation for second state, e.g., state 9 using first verify voltage Vpre2 and second verify voltage Vfy2, may be performed. Then the verify read operations for states 10 to 15 may be sequentially performed, and then the memory cells determined as program-fail are reprogrammed by an iterative loop. Until all the memory cells are determined as program-pass, the program operation and verify operation may be repeated. The verify read operations may be respectively performed on the memory cells programmed with states 8 to 15 by sequentially supplying the first verify voltages 10 and the second verify voltages 20 to the word line.

Figure 2:
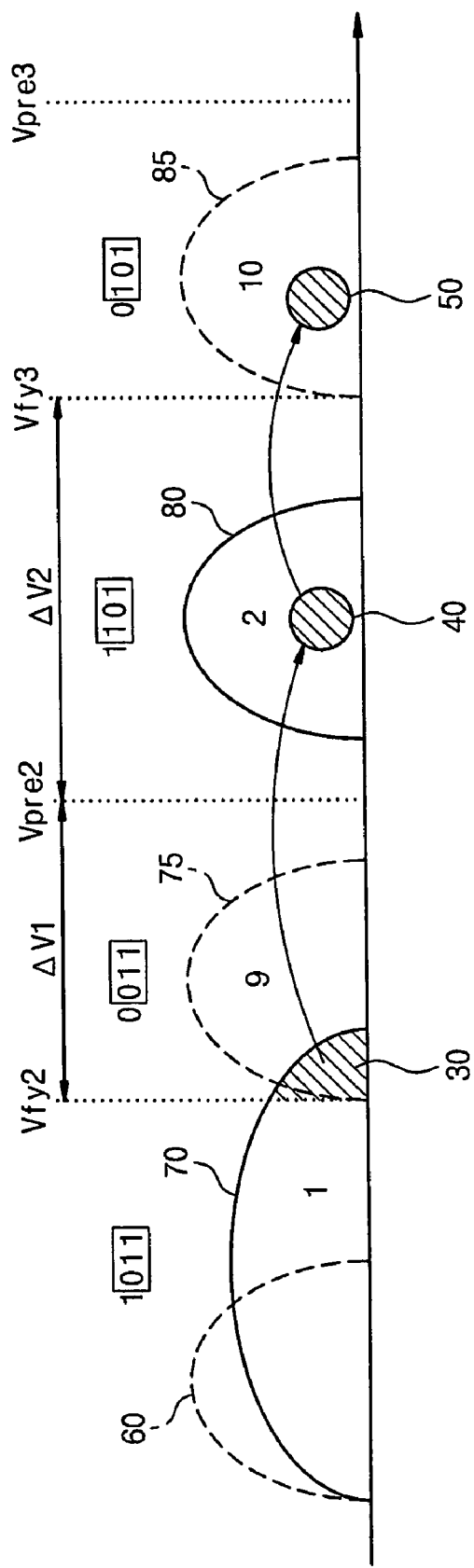
FIG. 2 illustrates a programming error occurring according to the comparative example of a programming method illustrated in FIG. 1.

In FIG. 2, under an ideal circumstance (hereafter, normal circumstance) of there being only normal cells, threshold voltage distributions 60 and 80 would be populated with memory cells as a result of programming according to a third page of program data and threshold voltage distributions 75 and 85 would be populated with memory cells as a result of programming according to a fourth page of program data. In actual operation, however, the presence of fast cells among the memory cells being programmed by the third program operation may distort the normal threshold voltage distribution 60 into a threshold voltage distribution 70 by pushing an upper boundary of the distribution higher. Fast cells accumulate charge in their floating gates at a rate higher than is typical for normal cells. Hence, for a given duration of a given program operation, fast cells will achieve relatively higher threshold voltages than normal cells. The overlapping portions of the threshold voltage distributions 70 and 75 represents a threshold voltage distribution 30 of the fast cells.

In FIG. 2, the fast cells in the threshold voltage distribution 30 were intended to represent the four bit value 1011 as a result of the fourth program operation, but instead have threshold voltages that represent the four bit value 0011. Additionally, those fast cells in the threshold voltage distribution 30 that were intended to reach the voltage threshold distribution 75 only as a result of the fourth program operation accordingly have corresponding fourth page program data that is logic 0. The fast cells become excessively programmed by the fourth program operation, resulting in threshold voltages that are higher than intended. The unintentionally high threshold voltages place the fast cells in the threshold voltage distribution 40 or possibly in the threshold voltage distribution 50.

Those fast cells from the threshold voltage distribution 30 that become excessively programmed into the threshold voltage distribution 40 are read as storing the 4-bit value 1101 as a result of the fourth program operation, rather than the intended 4-bit value 0011. After applying the program voltage during the third program operation, the fast cells falling within the threshold voltage distribution 30 are not set to have program-inhibit status because the third program verify operations do not check for memory cells having threshold voltages that fall between the first verify voltage Vpre2 and the second verify voltage Vfy2 corresponding to threshold voltage state 9. This is because of an assumption that threshold voltage state 9 will be populated only as of the fourth program operation, i.e., an assumption that no cells will fall into the threshold voltage state 9 as a result of the third program operation.

Again, the fast cells in the voltage threshold distribution 30 also fall within the threshold voltage distribution 75, but not as an intended consequence of the third program operation. The program verify operations performed for the threshold voltage distributions 60 and 80 that are performed as a part of the third program operation do not use verify voltage ranges which include the threshold voltages of the threshold voltage distribution 30 due to the assumption noted above.

When not set to have program-inhibit status, some fast cells falling within the threshold voltage distribution 30 may be further programmed with yet higher threshold voltages corresponding to a threshold voltage distribution 40 that overlaps the threshold voltage distribution 80. Accordingly, the fast cells falling within the threshold voltage distribution 30 that should have represented the 4-bit value 1011 after the fourth program operation actually fall within the threshold voltage distribution 40 and represent the 4-bit value 1101. Consequently, the fast cells have a 2-bit error due to a program operation of the fourth page of program data, i.e., they have an error at bit 1 and an error at bit 2.

Furthermore, even those fast cells in the threshold voltage distribution 30 which were not further programmed by the fourth program operation (because of corresponding to logic 1 in the fourth page of program data), still have a 1-bit error. These fast cells are read as storing the 4-bit value 0011 rather than the 4-bit value 1011, i.e., they have an error at bit 3. The 1-bit error may be correctable by a read operation through, e.g., a maximum likelihood method.

These error occurrences burden an error correction operation based upon fractional read and soft decision, e.g., which utilize a relative distance to a threshold voltage of memory cells from a reference value (e.g., an average value of distribution) of threshold voltage distribution. As another example of the 2-bit error, fast cells in a threshold voltage distribution 50 (that overlaps with the threshold voltage distribution 85) are read as storing the 4-bit value 0101, and need to be corrected to read as storing the 4-bit value 0011. In effect, the threshold voltage distribution 50 has become shifted by more than a value $\Delta V2$ away from the intended voltage distribution 75 corresponding to the 4-bit value 0011, and this difference causes a significant load upon an error correction operation. Reducing, if not preventing, such 2-bit programming errors associated with fast-cell would significantly reduce the error correction load. At least one embodiment of the present invention can reduce or prevent such 2-bit programming errors associated with fast cells, and thus can significantly reduce the error correction load.

Embodiments of the present invention were developed, in part, based upon a recognition that the assumptions, noted above, are flawed. In accordance with embodiments, the fast cells falling within a threshold voltage distribution may be set to have program-inhibit status by preliminary verify read operations associated with a subsequent program operation, e.g., as described with respect to FIG. 3.

Figure 3:
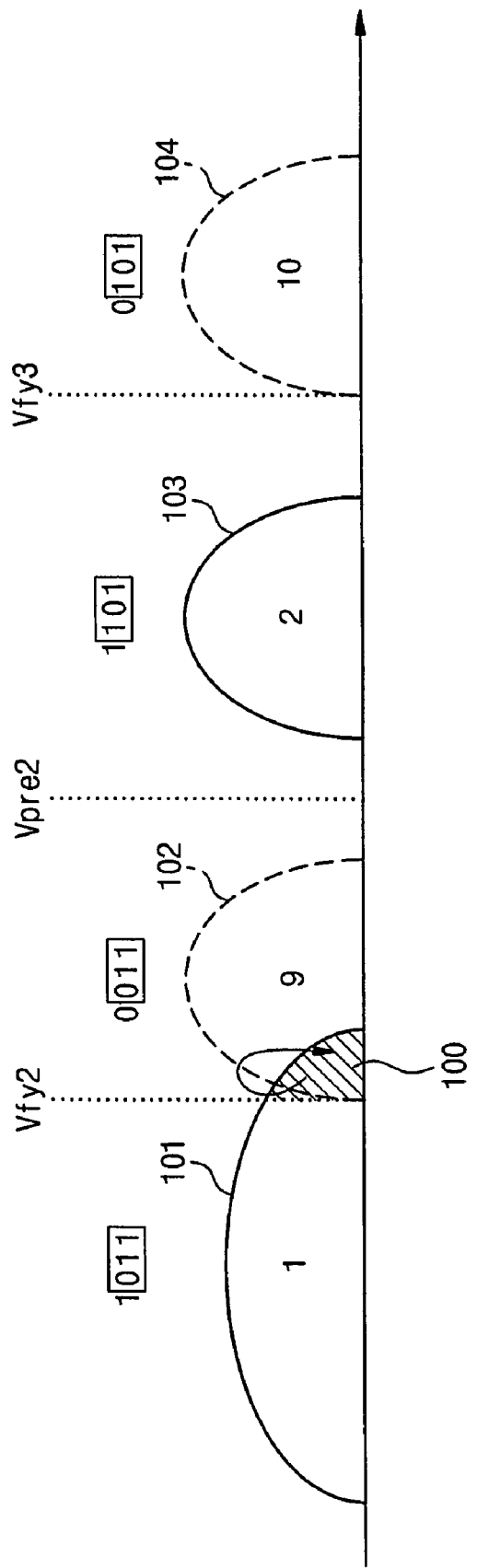
FIG. 3 illustrates how a method of programming multi bit memory cells of a flash memory device according to an exemplary embodiment of the present invention may reduce or prevent the programming error.

A context of FIG. 3 may be understood as programming a multi bit flash memory device according to a multi-page programming technique. Referring to FIG. 3, a method of programming multi bit, i.e., n bit, memory cells of a flash memory device according to an exemplary embodiment of the present invention may perform $k^{th}$ preliminary verify read operations before performing a $k^{th}$ program operation according to a $k^{th}$ page of program data, where n and k integers, $n \geq 2$, and $1 \leq k \leq n$, e.g., n=4. That is, where a $(k-1)^{th}$ program operation produces one or more expanded threshold voltage distribution regions due to the presence of fast cells, the $k^{th}$ preliminary verify read operations may detect fast cells that have already reached their target threshold states without having had to undergo the $k^{th}$ program operation. The $k^{th}$ preliminary verify read operations also may set the detected fast cells to have program-inhibit status so as to reduce or prevent undesired further programming of the detected fast cells that would otherwise occur during the $k^{th}$ program operation; see above for a discussion of such undesired further programming. Stated differently, the $k^{th}$ preliminary verify read operations may be used as part of a procedure to program a next more significant bit (NMSB) according to a $k^{th}$ page of program data. In the circumstance that k=n−1, the NMSB would also represent the most significant bit (MSB) of the n-bit data.

To simplify discussion, FIG. 3 reflects an assumption that k=n=4. As such, FIG. 3 is illustrated with the assumption that the $(k-1)^{th}$ program operation, i.e., the third program operation, has been performed. To further simplify discussion: only threshold voltage states 1, 2, 9 and 10 are illustrated in FIG. 3; and, as a result of the third program operation, it is assumed that fast cells are present only in a threshold voltage distribution 100.

In FIG. 3, the threshold voltage distribution 100 also represents a region where threshold voltage distributions 101 and 102 overlap. If not prevented, the $k^{th}$ (i.e., the fourth, in this example) program operation would further program the fast cells corresponding to the threshold voltage distribution 100 into a state 2 or 10 once a program voltage is applied to the word line; see the discussion above regarding a fourth program operation, in a manner as set forth in the preceding discussion of the comparative example. Accordingly, at least one embodiment of the present invention may perform the $k^{th}$ (i.e., the fourth, in this example) preliminary verify read operation that inhibit further programming of the fast cells before performing the fourth program operation.

In general, a $k^{th}$ programming procedure may include $k^{th}$ preliminary read verify operations and a $k^{th}$ program operation. The $k^{th}$ program operation may include an iterative loop. The iterative loop may include a program execution interval and a program verify operation.

Returning to the example of FIG. 3, the fourth programming procedure carried out according to the fourth page of program data may start from the fourth preliminary verify read operations that may use first verify voltages Vpre1 to Vpre8 and second verify voltages Vfy1 to Vfy8, respectively, as is illustrated in FIG. 1. As noted above regarding assumptions related to FIG. 3, due to the presence of fast cells, the third program operation may prematurely populate at least one threshold voltage distribution with memory cells. That is, the threshold voltage distribution 102 would not have been populated with memory cells after the third program operation but for the presence of the fast cells. The fourth preliminary verify read operations check whether memory cells have threshold voltages falling within threshold voltage distributions that, under normal circumstances, would not be populated after the third program operation.

Accordingly, results of the fourth preliminary verify read operations may include detection of the fast cells in the threshold voltage distribution 100 and setting of these cells to have program-inhibit status. The results of the fourth preliminary verify read operations may be achieved before the fourth program operation begins.

In more detail, the fourth preliminary verify read operations may determine that the threshold voltages of the fast cells already exist between the first verify voltage Vpre2 and the second verify voltage Vfy2, and that the corresponding bit values of the fourth page of program data for the fast cells are logic 0. If the fast cells instead had been normal, then the following would have been true: their threshold voltages would have been fallen between the first verify voltage Vpre2 and the second verify voltage Vfy2 after the third program operation; and their correspondence to logic 0 bit values in the fourth page of program data would have resulted in the their threshold voltages having been raised so as to fall into the threshold voltage distributions 102 as a result of the fourth program operation.

Because the fourth preliminary read operation detects the fast cells in the voltage distribution 100 as already falling between the first verify voltage Vpre2 and the second verify voltage Vfy2, these fast cells may be set to have program-inhibit status. The fourth preliminary verify read operations may be performed on each of the threshold voltage states 8 to 15. After the preliminary verify read operations are performed, any fast cell, which prematurely exists in a voltage distribution, will have been set to have program-inhibit status. Then, the fourth program operation may follow.

Setting the fast cells to have program-inhibit status by the fourth preliminary verify operations may avoid further programming by the fourth program operation. As a result, despite there being values of the fourth page program data that otherwise would have caused the fast cells to become further programmed during the fourth program operation, the fast cells that are program-inhibited may maintain the threshold voltages that placed them in the threshold voltage distribution 100, and thus may avoid the 2-bit programming error, described above.

The aspects of detecting fast cells and setting them to have program-inhibit status have been described above as preceding the aspect of selecting those memory cells for which the corresponding values in a $k^{th}$ page of program data are logic 0. Alternatively, the aspect of selecting could precede, or be concurrent with, the aspects of detecting and setting.

Figure 4:
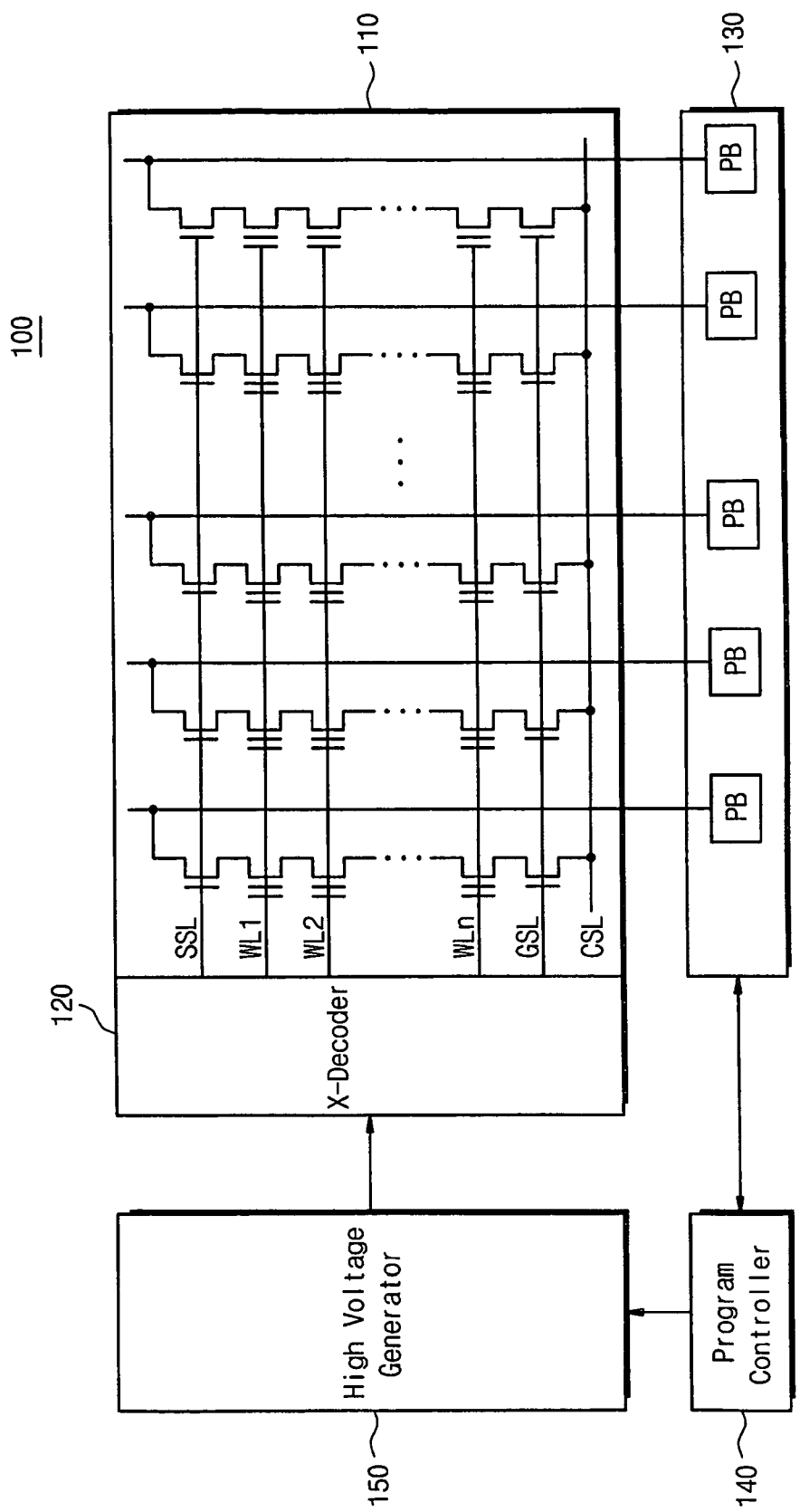
FIG. 4 illustrates a block diagram of a multi bit flash memory device according to an exemplary embodiment of the present invention.

Referring to FIG. 4, a multi bit flash memory device 100 may include a memory cell array 110, a row detector 120, a page buffer block 130, a programming controller 140 and a high voltage generator 150. For a given page of program data, the programming controller 140, may be adapted to perform the preliminary verify read operations that detect fast cells and set them to have program-inhibit status, as discussed above, before performing program operation according to the given page of program data. The cell array 110 may include multi bit flash memory cells storing multi bit, namely n-bit, data in one cell. In an exemplary embodiment, the cell array 110 may include memory cells storing 4-bit data, i.e., n=4. However, the present invention is not limited to the circumstance of n=4. The cell array 110 may include one of NAND type flash memory cells and NOR type flash memory cells.

The row decoder 120 may select a word line in response to a row address. The row decoder 120 may deliver various word line voltages from the high voltage generator 150 to selected word lines. During a program operation, a program voltage Vpgm (e.g., about 15 to 20 V) may be applied to a selected word line, and a pass voltage Vpass (e.g., about 10 V) may be applied to an unselected word line.

The page buffer block 130 may operate as a write driver or a detect amplifier according to an operation mode. For example, the page buffer block 130 may operate as the detect amplifier during a read operation mode, and may operate as the write driver during a program operation mode. During the program operation, the page buffer block 130 may perform a first preliminary read operation that provides one of the first verify voltages Vpre1 to Vpre8 to the selected word line. Additionally, the page buffer block 130 may perform a second preliminary read operation that provides one of the second verify voltages Vfy1 to Vfy8 to the word line of the memory cells on which the first preliminary read operation is performed. The results of the first and second preliminary read operations may be latched to a page buffer PB in the page buffer block 130.

The program controller 140 may detect fast cells with reference to the results of the first and second preliminary read operations that are latched to each page buffer PB. The detected fast cells may be set to have program-inhibit status before performing the $k^{th}$ (again, fourth, relative to the example of FIG. 3) program operation according to the $k^{th}$/fourth page of program data. The first and second preliminary read operations may constitute the preliminary verify read operation.

The program controller 140 may control the page buffer block 130 and the high voltage generator 150 to program sequentially input program data into the cell array 110. The program controller 140 first may perform a preliminary verify read operation after the $(k-1)^{th}$ (again, third, relative to the example of FIG. 3) program operation is finished. The program controller 140 may set the memory cells in an expanded threshold voltage distribution that have already achieved their target threshold state, namely the fast cells, to have program-inhibit status through the preliminary verify read operation. Once the preliminary verify read operation is finished, the program controller 140 may perform the $k^{th}$/fourth program operation, which may include repeating the loop a plurality of times until all the memory cells are determined as being program-pass.

The iterative loop may include a program execution interval for applying a program voltage to a word line of the selected memory cells, and a program verify interval for verifying the program execution operation. During the program verify interval, the first verify voltages Vpre1 to Vpre8 and the second verify voltages Vfy1 to Vfy8 may be alternately supplied to the word line of the selected memory cells, respectively. Simultaneously, the result of programming the memory cells may be detected by the page buffer block 130 and may be stored in a latch of each page buffer PB. The program controller 140 may repeat the loop for reprogramming (or, in other words, further program) with reference to the latched program verify result stored in the page buffer PB. Repeating the loop for purposes of reprogramming may be stopped when threshold voltage of all the memory cells reach their target states, respectively.

The high voltage generator 150 may generate an incremental step pulse programming (ISPP) voltage, first verify voltages Vpre1 to Vpre8 and second verify voltages Vfy1 to Vfy8 for programming, and may do so under the control of the program controller 140. The high voltage generator 150 may deliver the generated voltages to the row decoder 120. The row decoder 120 may provide the delivered voltages to the selected word lines. The high voltage generator 150 may generate a pass voltage Vpass to be supplied to the unselected word line during the program operation or verify operation.

Figure 5:
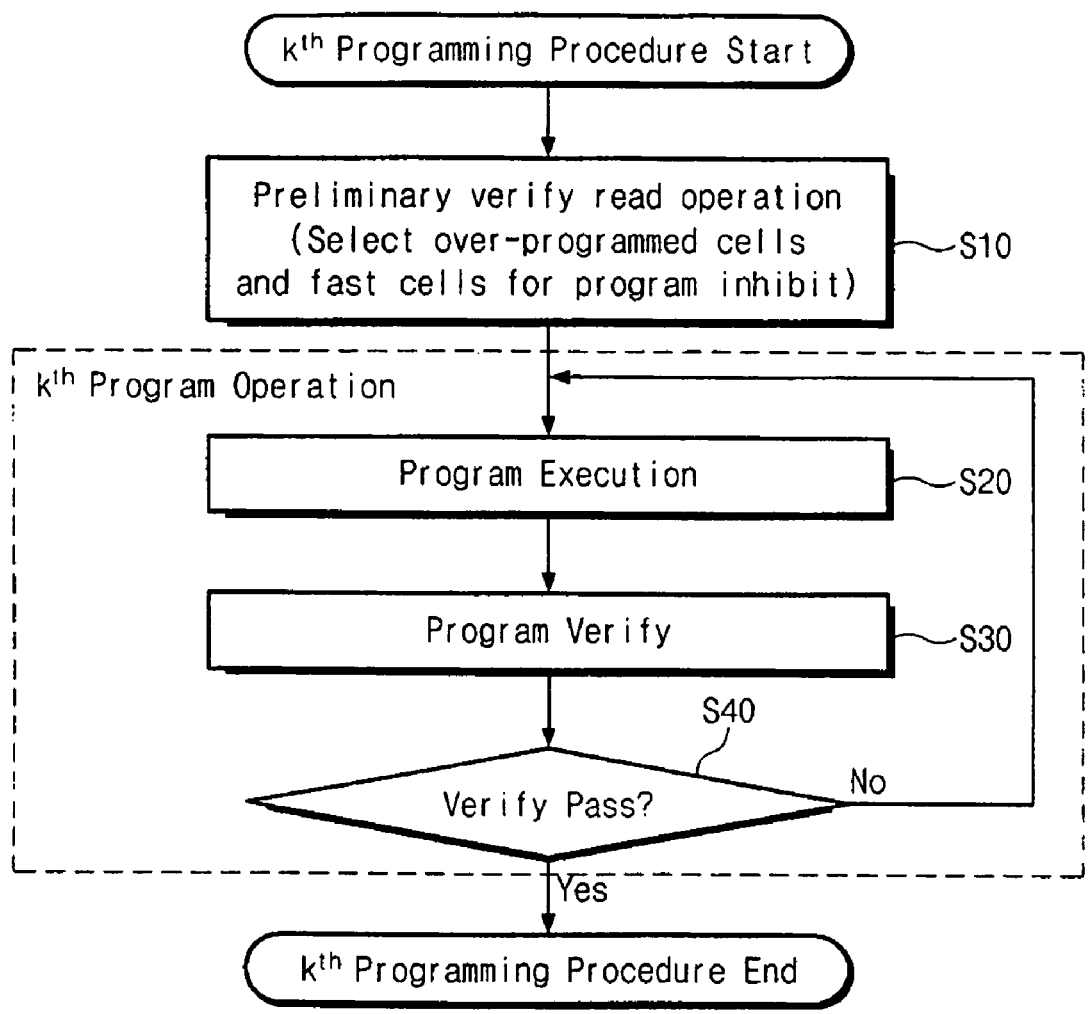
FIG. 5 illustrates a flowchart of a procedure, according to an exemplary embodiment of the present invention, for programming a multi bit flash memory device, e.g., that may be carried out by a program controller, e.g., as in FIG. 4.

FIG. 5 illustrates a flowchart of sequential operations representing a kth programming procedure, according to an exemplary embodiment of the present invention, that may be carried out by a program controller, e.g., the program controller 140. After the $(k-1)^{th}$ (again, third, relative to the example of FIG. 3) programming procedure is finished, a $k^{th}$ (again, fourth, relative to the example of FIG. 3) programming procedure may be performed. The $k^{th}$/fourth programming procedure may start with preliminary verify read operations that may detect whether fast cells already exist in target threshold voltages states, as in block S10.

The preliminary verify read operations of block S10 may perform a kind of verify read operation on states 8 to 15 that are intended to be populated only after the $k^{th}$/fourth program operation but that may be earlier populated due to the existence of fast cells. The preliminary verify read operations may sequentially provide a first verify voltage Vpre1 and a second verify voltage Vfy1 to a word line to detect fast cells programmed in a state 8. If there are fast cells programmed in a state 8 through a program operation of the $k^{th}$/fourth page of program data, these fast cells may be set to have program-inhibit status. Next, a first verify voltage Vpre2 and a second verify voltage Vfy2 may be supplied to the selected word line so that fast cells programmed in a voltage threshold state 9 may be detected. The detected fast cells in the voltage threshold state 9 may be set to have program-inhibit status. Preliminary verify read operations may be sequentially performed on remaining threshold voltages 10 to 15, respectively. After detecting whether any fast cells exist the threshold voltage state 15, and, if so, then setting fast cells of threshold voltage state 15 to have program-inhibit status, the preliminary verify read operations of block S10 may be stopped. Flow may then proceed from block S10 to the $k^{th}$/fourth program operation, which can be described as an iterative loop that may include a program execution interval as in block S20, program verify operations as in block S30 and a decision block S40. Based upon the results of decision block S40, the loop may be performed multiple times.

More particularly, the program execution interval may apply a program voltage Vpgm to a word line of the selected memory cells, as in block S20. After applying the program voltage Vpgm to the word line of the selected cells, program verify operations may proceed in order to detect whether programming is finished.

In block S30, the program verify operation may be performed under conditions similar to those of the preliminary verify read operations, e.g., using the same word line voltages. According to the results detected by the program verify operations, it may be determined whether all of the memory cells satisfy the program-pass condition.

The program controller 140 may determine whether programming is finished with reference to the data that was latched into the page buffer block 120 by the program verify operation in block S40. At decision block S40, when it is determined that the threshold voltages of all memory cells have reached their target threshold voltage states, respectively, then program controller 140 may terminate $k^{th}$/fourth program operation, and flow may proceed from decision block S40 to an endpoint of the $k^{th}$/fourth programming procedure. However, when it is determined that there are memory cells that satisfy the program-fail condition, flow may loop back to the program execution interval of block S20 for reprogramming the selected memory cells. Here, the program controller 140 may control the voltage generator 150 to increase a program voltage provided to the word lines of the selected memory cells with each loop through the blocks S20 to 40.

According to this embodiment, for the $k^{th}$ page of program data, the $k^{th}$ verify read operations may be performed before the $k^{th}$ program operation. The $k^{th}$ preliminary verify read operation can detect fast cells that already exist in their target threshold voltages states, respectively, and may set the fast cells to have program-inhibit status. Accordingly, undesired further programming of the detected fast cells that would otherwise occur during the $k^{th}$ program operation may be reduced or prevented.

Figure 6:
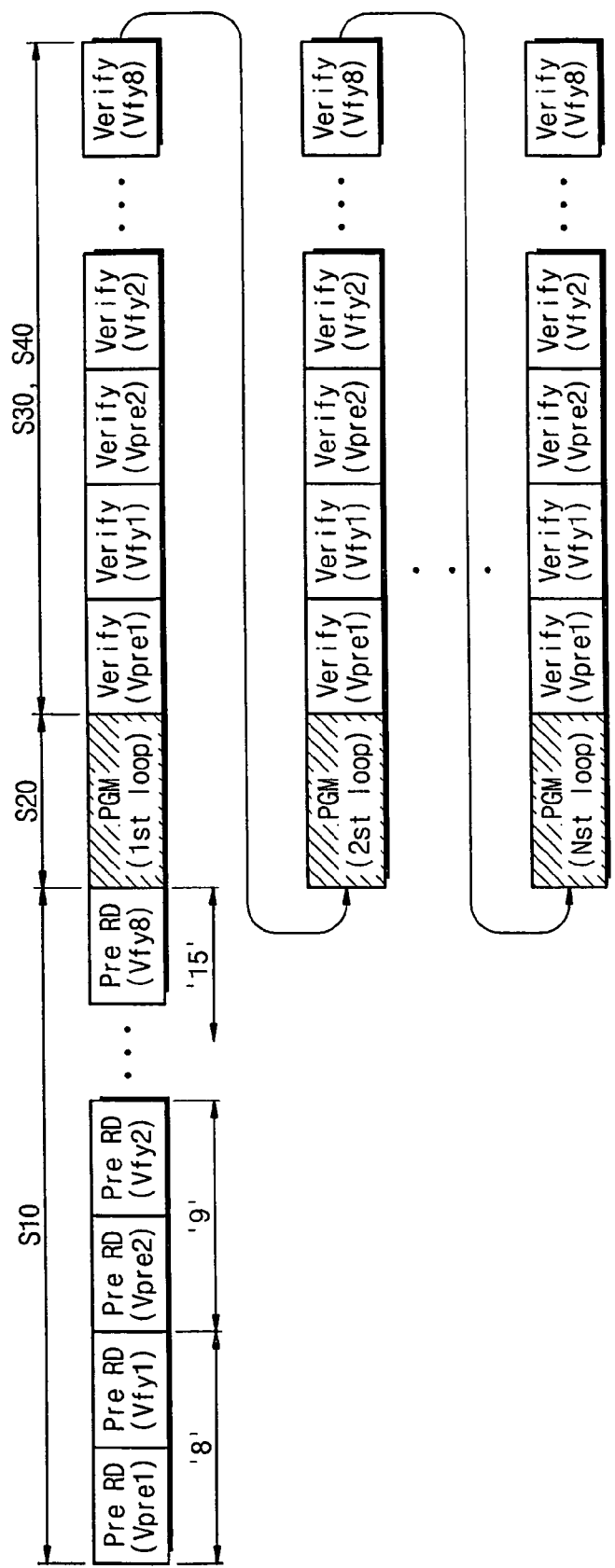
FIG. 6 illustrates a timing diagram, according to an exemplary embodiment of the present invention, of a procedure for programming a multi bit flash memory device.

Referring to FIG. 6, a programming method according to an exemplary embodiment of the present invention may perform preliminary verify read operations as in block S10 before performing a $k^{th}$ (again, fourth, relative to the example of FIG. 3) program operation as in blocks S20-S40. Fast cells programmed in a threshold voltage state 8 may be detected by preliminary verify read operation Pre RD using the first verify voltage Vpre1 and the second verify voltage Vfy1. The detected fast cells may be set to have program-inhibit status. Then, the preliminary verify read operation may be repeated in order to detect fast cells having threshold voltages that fall into threshold voltage state 9. The fast cells having threshold voltages in threshold voltage state 9 may be detected using the first verify voltage Vpre2 and the second verify voltage Vfy2. The preliminary verify read operation may be sequentially performed to detect the fast cells having threshold voltages in threshold voltage states 10-15. The preliminary verify read operations may be stopped when all fast cells that already exist in their target threshold voltage states, respectively, have been set to have program-inhibit status.

Then, the $k^{th}$/fourth program operation may be performed according to the $k^{th}$/fourth page of program data. The memory cells determined as program-fail during a first iteration of the loop are reprogrammed in a second iteration of the loop. Looping may be stopped when all of the selected memory cells have reached their target threshold voltage states.

Figure 7:
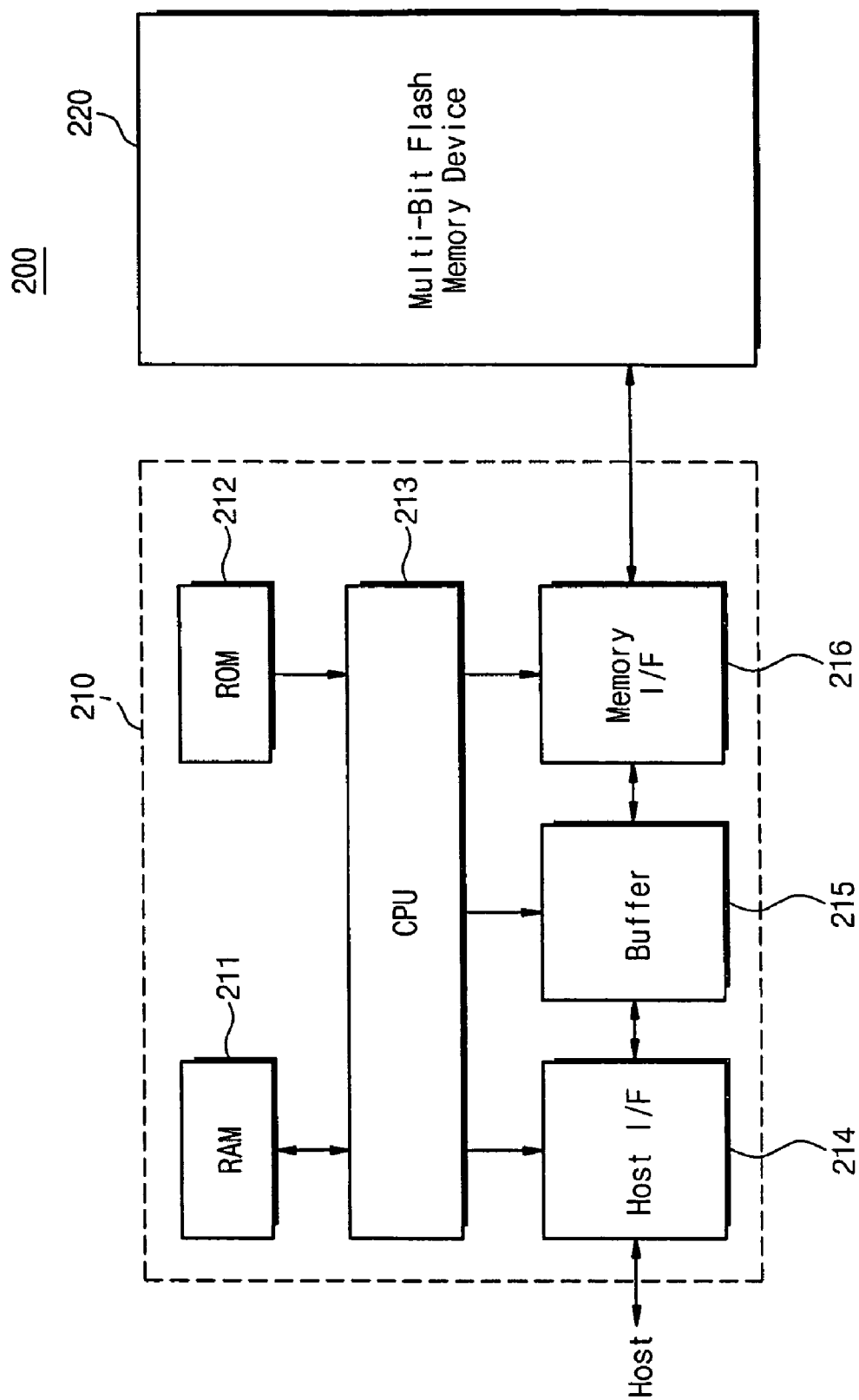
FIG. 7 illustrates a block diagram of a memory card with a multi bit flash memory device, according to an exemplary embodiment of the present invention.

Referring to FIG. 7, a memory card 200 for high capacity data storage may include a multi bit flash memory device 220 and a memory controller 210. The memory controller 210 may control a general data exchange between a host and the multi bit flash memory device 220. The memory controller 210 may include a random access memory (RAM) 211, a read-only memory 212, a central processing unit (CPU) 213, a host interface (I/F) 214, a buffer 215 and a memory IF 216. The ROM 212 may store code data for interfacing with the host. The RAM 211 may represent an operating memory of a CPU 213. The host I/F 214 may use a first protocol to communicate with the host. The memory I/F 216 may use a second protocol to communicate with the multi bit flash memory device 220. The buffer 215 may temporarily store data being exchanged between the host the multi bit flash memory device 220. The CPU 213 generally may perform the exchange of data between the host the multi bit flash memory device 220. Although not illustrated in the drawings, it should be apparent to those skilled in the art that the memory card 200 further may include an error correction code (ECC) block.

According to one or more embodiments of the present invention, 2-bit programming errors, which otherwise are caused by undesired further programming of fast cells that already have achieved their target threshold voltages, can be reduced or prevented. A benefit of reducing or preventing such 2-bit programming errors is that more reliable multi bit flash memory devices can be realized.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of programming a multi bit flash memory device having n-bit memory cells, where n is an integer and $n \geq 2$, via n program operations performed according to n pages of program data, respectively, the method comprising:
   detecting, before a $k^{th}$ program operation, memory cells that already have reached target threshold voltage states, respectively, where k is an integer and $1 \leq k \leq n$;
   setting the detected memory cells to have a program-inhibit status; and
   performing the $k^{th}$ program operation to make non-program-inhibited memory cells achieve target threshold voltage states, respectively.

2. The method as claimed in claim 1, wherein n=4 such that each of the memory cells of the multi bit flash memory device stores 4-bit data corresponding to sequentially provided first to fourth pages of program data.

3. The method as claimed in claim 1, wherein the setting of a given detected memory cell to have program-inhibit status and the performing of the $k^{th}$ program operation determine a next more significant bit (NMSB) of the n-bit data to be stored in the given memory cell.

4. The method as claimed in claim 1, further comprising:
   selecting memory cells for the $k^{th}$ program operation according to a $k^{th}$ page of program data such that only non-program-inhibited memory cells are operated upon when performing the $k^{th}$ program.

5. The method as claimed in claim 4, wherein the detecting and the setting precede the selecting.

6. The method as claimed in claim 4, wherein the performing of the $k^{th}$ program operation includes:
   providing a program voltage to a word line of the selected memory cells;
   verifying whether non-program-inhibited ones amongst the selected memory cells are programmed with a target threshold voltage or not; and
   repeating the providing of the program voltage and the verifying until threshold voltages of the non-program-inhibited memory cells reach the target threshold voltage states, respectively.

7. The method as claimed in claim 4, wherein the selecting of memory cells includes selecting ones for which corresponding values in the $k^{th}$ page of program data are logic 0.

8. The method as claimed in claim 1, further comprising:
   providing a program voltage to word lines of the non-program-inhibited memory cells; and
   post-program verifying whether the non-program-inhibited memory cells have been programmed with target threshold voltages.

9. The method as claimed in claim 8, wherein:
the providing of the program voltage and the post-program verifying are included in an iterative loop; and
the method further comprises repeating the loop until threshold voltages of the non-program-inhibited memory cells achieve the target threshold voltage states, respectively.

10. The method as claimed in claim 8, wherein, for a given threshold voltage state, the post-program verifying includes determining which of the non-program-inhibited memory cells have threshold voltages falling between a lower verify voltage and an upper verify voltage.

11. The method as claimed in claim 1, wherein the detecting, before a $k^{th}$ program operation, of memory cells that already have reached target threshold voltage states, respectively, includes:
performing preliminary read verify operations for voltage threshold states that are intended to populate with memory cells as a result of the $k^{th}$ program operation.

12. The method as claimed in claim 11, wherein the preliminary verify read operations, for a given threshold voltage state, include determining which memory cells have threshold voltages falling between a lower verify voltage and an upper verify voltage.

13. The method as claimed in claim 1, wherein the setting of the detected memory cells to have the program-inhibit status maintains substantially the same threshold values for the detected memory cells before and after the $k^{th}$ program operation.

14. A multi bit flash memory device, comprising:
a cell array including a plurality of n-bit memory cells, where n is an integer and $n \geq 2$;
a page buffer block connected to bit lines of the memory cells and adapted to perform read and program operations of the memory cells;
a program controller adapted to perform at least the following,
detecting, before performing a $k^{th}$ program operation according to a $k^{th}$ page of program data, memory cells that already have reached target threshold voltage states, respectively, where k is an integer and $1 \leq k \leq n$, and
setting the detected memory cells to have a program-inhibit status; and
a high voltage generator adapted to provide a voltage to word lines of non-program-inhibited memory cells for the $k^{th}$ program operation or a post-$k^{th}$-program verify operation.

15. The flash memory device as claimed in claim 14, wherein the setting of a given detected memory cell to have program-inhibit status by the program controller and the providing of a voltage to the word line connected to the given memory cell for the $k^{th}$ program operation by the high voltage generator a next more significant bit (NMSB) of the n-bit data to be stored in the given memory cell.

16. The flash memory device as claimed in claim 14, wherein, for a given threshold voltage state, the program controller is further adapted to perform at least a post-program verify operation by determining which of the non-program-inhibited memory cells have threshold voltages falling between a lower verify voltage and an upper verify voltage.

17. The flash memory device as claimed in claim 14, wherein the program controller detects, before the $k^{th}$ program operation, memory cells that already have reached target threshold voltage states, respectively, by performing preliminary read verify operations for voltage threshold states that are intended to be populated with memory cells as a result of the $k^{th}$ program operation.

18. The flash memory device as claimed in claim 17, wherein the program controller performs the preliminary verify read operations, for a given threshold voltage state, by determining which memory cells have threshold voltages falling between a lower verify voltage and an upper verify voltage.

19. The flash memory device as claimed in claim 14, wherein the memory cells are one of NAND type flash memory cells and NOR type flash memory cells.

20. A memory system comprising:
a memory controller; and
a flash memory device operatively connected to the memory controller, the flash memory device including at least the following,
a cell array including a plurality of n-bit memory cells, where n is an integer and $n \geq 2$,
a page buffer block connected to bit lines of the memory cells and adapted to perform read and program operations of the memory cells,
a program controller, and
a high voltage generator;
the program controller being adapted to perform at least the following,
detecting, before performing a $k^{th}$ program operation according to a $k^{th}$ page of program data, memory cells that already have reached target threshold voltage states, respectively, where k is an integer and $1 \leq k \leq n$, and
setting the detected memory cells to have a program-inhibit status; and
the high voltage generator being adapted to provide a voltage to word lines of non-program-inhibited memory cells for the $k^{th}$ program operation or a post-$k^{th}$-program verify operation.

* * * * *